US012081225B2

(12) United States Patent
Herbsommer et al.

(10) Patent No.: US 12,081,225 B2
(45) Date of Patent: *Sep. 3, 2024

(54) PACKAGE FOR MILLIMETER WAVE MOLECULAR CLOCK

(71) Applicant: Texas Instruments Incorporated, Dallas, TX (US)

(72) Inventors: Juan Alejandro Herbsommer, Allen, TX (US); Nikita Mahjabeen, Richardson, TX (US); Hassan Omar Ali, Murphy, TX (US); Meysam Moallem, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/334,312

(22) Filed: Jun. 13, 2023

(65) Prior Publication Data

US 2023/0327678 A1 Oct. 12, 2023

Related U.S. Application Data

(63) Continuation of application No. 17/246,300, filed on Apr. 30, 2021, now Pat. No. 11,677,406.

(Continued)

(51) Int. Cl.
*H03L 7/26* (2006.01)
*G01N 29/44* (2006.01)
(Continued)

(52) U.S. Cl.
CPC ............... *H03L 7/26* (2013.01); *G01N 29/44* (2013.01); *G04F 5/145* (2013.01); *G06F 1/12* (2013.01);
(Continued)

(58) Field of Classification Search
CPC .. H03L 7/26; H03L 7/06; G01N 29/44; G04F 5/145; G06F 1/12; G06F 1/14;
(Continued)

(56) References Cited

U.S. PATENT DOCUMENTS 9,529,334 B2 * 12/2016 Herbsommer ......... G01N 29/44
2019/0204786 A1 * 7/2019 Herbsommer ......... H03B 17/00
2020/0403299 A1 12/2020 Gupta

* cited by examiner

*Primary Examiner* — Arnold M Kinkead
(74) *Attorney, Agent, or Firm* — Dawn Jos; Frank D. Cimino

(57) ABSTRACT

In a described example, an apparatus includes a package substrate having a device side surface and a board side surface opposite the device side surface, a physics cell mounted on the device side surface having a first end and a second end, a first opening extending through the package substrate and lined with a conductor, aligned with the first end, a second opening extending through the package substrate and lined with the conductor, aligned with the second end, a millimeter wave transmitter module on the board side, having a millimeter wave transfer structure including a transmission line coupled to an antenna aligned with the first opening, and a millimeter wave receiver module mounted on the board side surface of the package substrate and having a millimeter wave transfer structure including a transmission line coupled to an antenna for receiving millimeter wave signals, aligned with the second opening.

28 Claims, 8 Drawing Sheets

Related U.S. Application Data

(60) Provisional application No. 63/133,231, filed on Dec. 31, 2020.

(51) Int. Cl.
| | |
|---|---|
| *G04F 5/14* | (2006.01) |
| *G06F 1/12* | (2006.01) |
| *H01P 3/00* | (2006.01) |
| *H01P 3/12* | (2006.01) |
| *H01P 5/107* | (2006.01) |
| *H01Q 1/22* | (2006.01) |
| *H01Q 1/38* | (2006.01) |
| *H01Q 13/18* | (2006.01) |
| *H03L 7/06* | (2006.01) |
| *H04B 1/40* | (2015.01) |
| *H05K 1/02* | (2006.01) |

(52) U.S. Cl.
CPC .............. *H01P 3/003* (2013.01); *H01P 3/006* (2013.01); *H01P 3/121* (2013.01); *H01P 5/107* (2013.01); *H01Q 1/2283* (2013.01); *H01Q 1/38* (2013.01); *H01Q 13/18* (2013.01); *H03L 7/06* (2013.01); *H04B 1/40* (2013.01); *H05K 1/0243* (2013.01)

(58) Field of Classification Search
CPC .......... H01P 3/003; H01P 3/006; H01P 3/121; H01P 5/107; H01Q 1/2283; H01Q 1/38; H01Q 13/18; H01Q 1/36; H04B 1/40; H05K 1/0243
USPC ..................................... 331/3, 94.1
See application file for complete search history.

PACKAGE FOR MILLIMETER WAVE MOLECULAR CLOCK

CROSS REFERENCE TO RELATED APPLICATIONS

This application is a continuation to U.S. patent application Ser. No. 17/246,300, filed Apr. 30, 2021, which claims the benefit of and priority to U.S. Provisional Application No. 63/133,231, filed Dec. 31, 2020 which is hereby incorporated by reference herein in its entirety.

TECHNICAL FIELD

This relates generally to packaging electronic devices, and more particularly to packaging semiconductor devices and a physics cell in a millimeter wave molecular clock module.

BACKGROUND

Increasingly, highly accurate and stable clocks are needed for applications such as navigation and ranging, autonomous vehicle control, and location services on devices including portable and handheld devices. A physics cell includes a dipolar gas that exhibits quantum rotational transitions. The physics cell can be used to form a reference signal for a clock. The physics cell includes the dipolar gas in a sealed gas chamber. Electromagnetic energy in the form of a millimeter wave frequency signal, in an example a signal of over 100 GHz, is transmitted to the physics cell by a millimeter wave transmitter, and remaining signal energy is received from the physics cell by a millimeter wave receiver. The dipolar gas in the physics cell absorbs maximum energy at quantized frequencies which cause a molecular rotational transition. The transmitted signal frequency can be adjusted until a molecular rotational transition is detected, the energy absorption of the molecular rotation transition can be detected as a drop in amplitude of the remaining energy received from the physics cell. The transmitted signal frequency can be locked to the quantized molecular rotation frequency. Because the quantized molecular rotation frequency is highly stable over temperature and over time, the locked transmitted frequency signal can be used as a stable reference for generating a clock signal or a reference frequency signal. A cost effective, robust and reliable package for the millimeter wave molecular clock module is needed.

SUMMARY

In a described example, an apparatus includes: a package substrate having a device side surface and a board side surface opposite the device side surface; a physics cell mounted on the device side surface of the package substrate and having a first end and a second end; a first opening extending through the package substrate and lined with a conductor, the first opening aligned with the first end of the physics cell; a second opening extending through the package substrate and lined with the conductor, the second opening aligned with the second end of the physics cell; a millimeter wave transmitter module mounted on the board side surface of the package substrate, having a millimeter wave transfer structure including a transmission line e coupled to an antenna configured to transmit millimeter wave signals aligned with the first opening; and a millimeter wave receiver module mounted on the board side surface of the package substrate and having a millimeter wave transfer structure including a transmission line coupled to an antenna for receiving millimeter wave signals from the physics cell, and aligned with the second opening.

DETAILED DESCRIPTION

Figure 1:
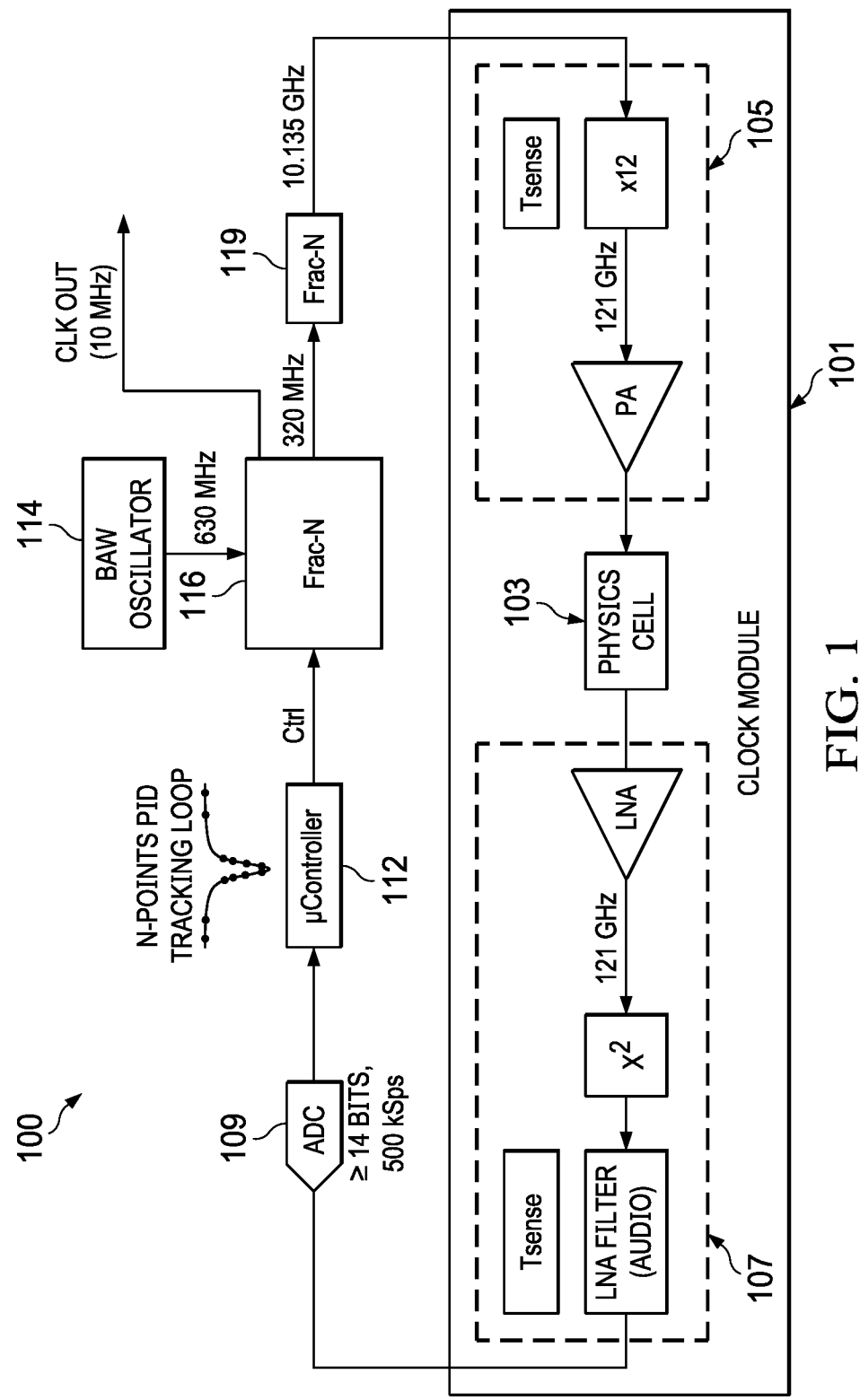
FIG. 1 is a block diagram of an arrangement for a molecular clock system.

Corresponding numerals and symbols in the different figures generally refer to corresponding parts, unless otherwise indicated. The figures are not necessarily drawn to scale.

Elements are described herein as "coupled." As used herein, the term "coupled" includes elements that are directly connected, and elements that are electrically connected even with intervening elements or wires are coupled.

The term "semiconductor die" is used herein. As used herein, a semiconductor die can be a discrete semiconductor device such as a bipolar transistor, a few discrete devices such as a pair of power FET switches fabricated together on a single semiconductor die, or a semiconductor die can be an integrated circuit with multiple semiconductor devices such as the multiple capacitors in an A/D converter. The semiconductor die can include passive devices such as resistors, inductors, filters, or active devices such as transistors. The semiconductor die can be an integrated circuit with hundreds or thousands of transistors coupled to form a functional circuit, for example a microprocessor or memory device. The semiconductor die can be a passive device such as a sensor, example sensors include photocells, transducers, and charge coupled devices (CCDs), or can be a micro electro-mechanical system (MEMS) device, such as a digital micromirror device (DMD).

The term "packaged electronic device" is used herein. A packaged electronic device has at least one semiconductor die and has a package body that protects and covers the semiconductor device die. In some arrangements, multiple semiconductor dies can be packaged together. For example, a power metal oxide semiconductor (MOS) field effect transistor (FET) semiconductor device die and a logic semiconductor device die (such as a gate driver die or controller device die) can be packaged together to from a single packaged electronic device. Additional components such as physics cells, and other passives can be included in the packaged electronic device. The semiconductor device die can be mounted to a substrate that provides conductive leads, a portion of the conductive leads form the terminals for the packaged electronic device. The semiconductor die can be mounted to the substrate with an active device surface facing away from the substrate and a backside surface facing and mounted to the substrate. Alternatively, the semiconductor device die can be flip-chip mounted with the active surface facing the substrate surface, and the semiconductor device die mounted to the leads of the substrate by conductive columns or solder balls. The packaged electronic device can have a package body formed by a thermoset epoxy resin in a molding process, or by the use of epoxy, plastics, or resins that are liquid at room temperature and are subsequently cured. The package body may provide a hermetic package for the packaged electronic device. The package body may be formed in a mold using an encapsulation process, however, a portion of the leads of the substrate are not covered during encapsulation, these exposed lead portions provide the exposed terminals for the packaged electronic device. The package body can be a metal shell or cover that protects a device. Protective fillers such as low modulus material can be used to protect the device.

The term "package substrate" is used herein. A package substrate is a substrate arranged to receive a semiconductor die or device and to support the semiconductor die or device in a completed semiconductor package. Package substrates include conductive lead frames, which can be formed from copper, aluminum, steel and alloys such as Alloy 42 and copper alloy. The lead frames can include a die pad for mounting the semiconductor die, and conductive leads arranged proximate to the die pad for coupling to bond pads on the semiconductor die using wire bonds, ribbon bonds, or other conductors. The lead frames can be provided in strips or arrays. Dies can be placed on the strips or arrays, the dies placed on a die pad for each packaged device, and die attach or die adhesive can be used to mount the dies to the lead frame die pads. Wire bonds can couple bond pads on the semiconductor dies to the leads of the lead frames. After the wire bonds are in place, a portion of the substrate, the die, and at least a portion of the die pad can be covered with a protective material such as a mold compound.

Alternative package substrates include pre-molded lead frames (PMLF) and molded interconnect substrates (MIS) for receiving semiconductor dies. In one example, a MIS package substrate is referred to as a "routable lead frame" or RLF. These substrates can include dielectrics such as liquid crystal polymer (LCP) or mold compound and can include one or more layers of conductive portions in the dielectrics. The lead frames can include plated, stamped and partially etched lead frames, in a partially etched lead frame, two levels of metal can be formed by etching a pattern from one side of the metal lead frame, and then from the other side, to form full thickness and partial thickness portions, and in some areas, all of the metal can be etched to form openings through the partial etch lead frames. Repeated plating and patterning can form multiple layers of conductors spaced by dielectrics, and conductive vias connecting the conductor layers through the dielectrics, the dielectrics can be mold compound. The package substrate can also be tape-based and film-based substrates carrying conductors; ceramic substrates, laminate substrates with multiple layers of conductors and insulator layers; and printed circuit board substrates of ceramic, fiberglass or resin, or glass reinforced epoxy substrates such as FR4. In an example arrangement, a package substrate of FR4 is used to mount a physics cell on a first surface, and millimeter wave transmitter and receiver modules are mounted on a second surface. Additional integrated circuits can be mounted to the package substrate.

The term "millimeter wave signal" is used herein. Millimeter wave signals have a frequency of between 30 GHz and 300 GHz. In example arrangements, frequencies of greater than 100 GHz, for example about 121 GHz or 133 GHz, are used to stimulate a physics cell. In the arrangements, a millimeter wave transmitter module is used, this module includes an integrated circuit that transmits millimeter wave signals. A millimeter wave receiver module is used in the arrangements, this module includes an integrated circuit that receives millimeter wave signals. In the arrangements, a frequency corresponding to a molecular rotation transition frequency is referred to. In an example, the frequency for a dipolar gas is 121.62 GHz. The molecular rotation frequencies for a dipolar gas are physical constants. However, in the arrangements a signal transmitted at a frequency transitions different materials and traverses dielectric materials and air. Some variation in the observed or transmitted frequency can occur, due to the materials used in the arrangements, so that a normal variance of +/−10% may be measured. In this description, when a particular frequency is described, a variance of +/−10% is included, so that a molecular rotational frequency of 121.62 GHz means 121.62 GHz+/−10%; and similar variance is included in other described frequencies.

The term "physics cell" is used herein. A physics cell is a cell which exhibits a physical constant. In the arrangements, a dipolar gas physics cell has quantized molecular rotation. In response to RF signals applied at one of a series of discrete frequencies, the molecules in the dipolar gas physics cell absorb the energy and transition from a first rotational state to a second rotational state. When energy at other frequencies away from the discrete quantized frequencies are applied to the physics cell, the molecules will not transition and the energy is not absorbed. Because the energy is almost completely absorbed by the cell at certain frequencies that correspond to quantized molecular rotational transitions, a receiver can detect when the transmitted frequency is at a quantization frequency for the cell, and a system can lock to the transmitted frequency. The quantized rotational frequencies correspond to a physical constant and are highly stable over time and over temperature, so that a stable constant frequency reference can be obtained by use of the physics cell.

In the arrangements, a package substrate has a physics cell mounted on a device side surface and millimeter wave transmitter module and a millimeter wave receiver module mounted on an opposing board side surface. A portion of the package substrate and the physics cell can be covered with a shell, dielectric, shield or lid to protect the physics cell. The millimeter wave transmitter module and the millimeter wave receiver module include millimeter wave integrated circuits mounted on high performance, high frequency circuit board substrates. The millimeter wave transmitter module and millimeter wave receiver module are mounted on a board side surface of the package substrate opposite the device side surface. Openings extending through the package substrate act as millimeter wave coupling elements, and operate as vertical waveguides. A first opening in the package substrate is arranged to receive a gigahertz frequency interrogation signal from the millimeter wave transmitter module. The first opening is lined with a conductor and forms a vertical waveguide, in an example the waveguide is sized to form a rectangular waveguide. The dipolar gas cell has an iris to receive energy at one end of the gas chamber, which receives the interrogation signal with high insertion loss and low reflectivity. At an opposite end of the dipolar gas cell, a second iris that transmits the remaining signal energy is coupled to a second rectangular opening in the package substrate, this second opening is also a vertical opening lined with a conductor and sized to form a rectangular waveguide. The millimeter wave receiver module is also provided on a high performance circuit board mounted on the board side surface of the package substrate and includes a signal probe on the end of a coplanar waveguide coupled to the second opening in the package substrate. The package substrate is, in one example, a fire resistant glass fiber reinforced epoxy, such as FR4. Other substrate materials can be used for the package substrate including ceramic and BT resin substrate materials. The package substrate is not required to be a high performance substrate, as the millimeter wave signals traverse openings extending through the package substrate, and the millimeter wave signals are not coupled to any traces within the dielectric materials of the package substrate. Use of low frequency substrate materials for the package substrate reduces cost for the package substrate and the molecular clock system. The arrangements provide a cost effective module for use in a molecular clock system, which has been shown in simulations to be highly stable over a wide temperature range.

FIG. 1 illustrates in a block diagram a molecular clock system 100. Module 101, which is a packaged molecular clock module of the arrangements, includes a physics cell 103, which in an example arrangement includes a dipolar gas in a sealed chamber, the dipolar gas can be an OCS (oxygen carbon sulfide) or carbonylsulfide, gas. The dipolar gas exhibits quantum molecular rotation so that when a signal of a frequency at a discrete rotational frequency is used to stimulate the gas in the physics cell, a quantum molecular rotation occurs that can be observed. Other dipolar gasses can be used, including the OCS, water vapor, hydrogen cyanide (HCN), hydrogen chloride (HCL), and acetonitrile ($CH_3CN$). The transmitted signal can then be used as a reference frequency, and the system can be locked to the quantized molecular rotation frequency of the physics cell in a control loop. In an example arrangement the frequency used is about 121.62 GHz, a molecular rotational frequency for OCS gas, but other transitions at other quantum rotation frequencies may be used. For example a second quantum rotation frequency for the OCS cell is at about 133.78 GHz.

A transmitter die 105 on a transmitter module is used to provide a millimeter wave interrogation signal to the physics cell 103. A receiver die 107 on a receiver module is coupled to receive the millimeter wave signal from the physics cell 103. The clock module 101 is coupled to an analog-to-digital converter (ADC) 109 which samples the analog signal from the clock module 101 and outputs a digital signal corresponding to the analog signal, indicating the amplitude or magnitude of the analog signal. A microcontroller 112 performs a control loop using, for example, proportional integral derivative (PID) control. The microcontroller 112 tunes a clock generated by controlling a fractional N circuit 116. The fractional N circuit 116 includes a PLL and a signal synthesizer and provides two outputs, one is a 10 MHz clock signal to be used as an output signal for system 100, which is the stable clock signal generated by the system, the other is a 320 MHz signal to be used in a feedback loop. An oscillator 114 provides a raw clock, for example a 630 MHz clock, to the fractional-N circuit 116, other raw clock input signals can be used. In an example this oscillator can be a bulk acoustic wave (BAW) device, other oscillators can be used. The fractional N circuit 116 has control inputs that allow the microcontroller 112 to adjust an output clock generated from the raw clock signal, and thus tune and lock the control loop. In this example arrangement, a second fractional N circuit 118 is shown receiving the 320 MHz clock and outputting a reference signal of 10.135 GHz, in another example an output can be 11.1487 GHz. The reference signal from the fractional N device 119 is input to module 101 and is used by the transmitter die 105 to generate the interrogation signal, for example of 121.62 GHz, by an up multiplier "×12". While two Frac-N devices are shown in the example of FIG. 1, in other arrangements a single Frac-N device can be used. In some arrangements the BAW oscillator 114 can be within the clock module 101.

In operation, the system 100 outputs a stable reference clock signal of 10 MHz using the physics cell 103 to develop a stable frequency reference used for generating the clock signal. The transmitter die 105 sends an interrogation signal near an expected quantum rotational frequency to the physics cell 103. The remaining signal output from the physics cell 103 is received by the millimeter wave receiver die 107, which outputs the power or amplitude of the remaining signal, and the output signal is filtered and conditioned and output to the ADC 109. A digital signal corresponding to the magnitude of the output signal from 101 is then input to microcontroller 112 for use in the PID control tracking loop. When the interrogation millimeter wave signal from the transmitter die 105 matches the quantum rotational frequency of the dipolar gas physics cell, the dipolar gas physics cell will absorb most of the energy, and the output signal into the millimeter receiver die 107 will be at an amplitude minimum. The microcontroller 112 can adjust the frequency output by fractional N circuit 116 until the minimum amplitude corresponding to the quantized rotational transition is observed, and when that is achieved, the microcontroller 112 can lock the circuit to the reference frequency of physics cell 103.

Figure 2A:
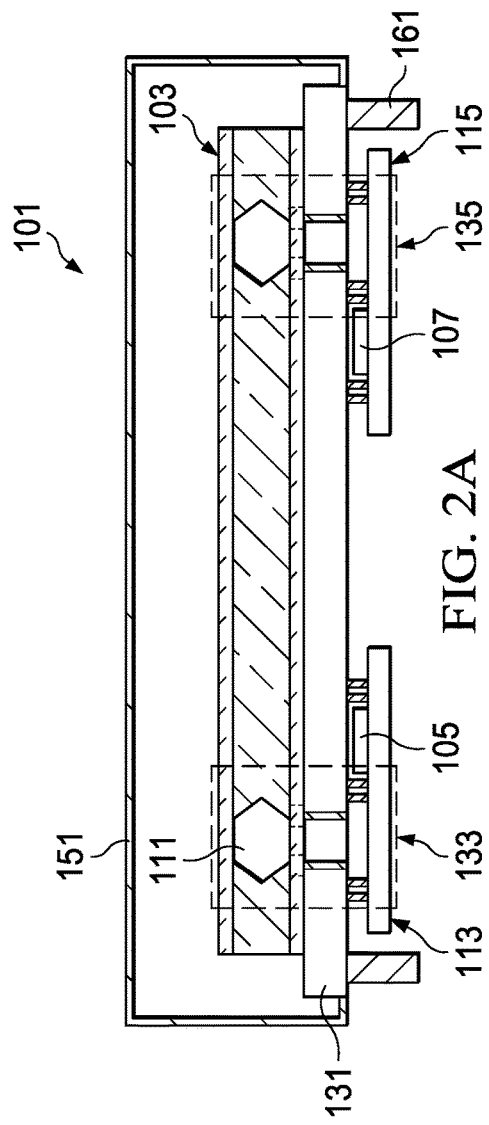
FIG. 2A is a cross section of a package arrangement for millimeter wave molecular clock module.

FIG. 2A illustrates in a cross sectional view a packaged millimeter wave clock module 101 of the arrangements. In FIG. 2A a physics cell 103 is mounted on a device side surface of a package substrate 131. A gas chamber 111 is shown in the cross section with two ends exposed, the gas chamber is continuous in the physics cell 103 which can be formed in a semiconductor substrate. The gas chamber 111 is sealed by glass bonded to the semiconductor substrate on two surfaces, and is lined on all sides of the gas chamber with a conductor such as gold. Other conductors of noble metals can be used to line the gas chamber. Other conductors can be used, and may be coated with anti-corrosion layers to ensure the gas in the chamber does not react with the conductors. Copper with additional coatings can be used. A millimeter wave transmitter module 113 is mounted on a board side surface of the package substrate 131, and transmitter die 105 is mounted on the module 113. A millimeter wave coupling structure 133 is formed between the millimeter wave transmitter module 113 and the physic cell 103. A millimeter wave receiver module 115 is mounted on the board side surface of the package substrate 131, and carries millimeter wave receiver integrated circuit 107. A millimeter wave receiver structure 135 couples the physics cell 103 to the millimeter wave receiver module 115. Terminals 161 for the package 101 are formed on the board side surface of the package substrate 131, so that the package 101 can be mounted to a system board. The terminals 161 can be ball grid array terminals such as solder balls, solder pillars, copper pillar pumps, copper columns, solder columns, stud bumps or other ball grid array connections. A lid 151 covers the physics cell 103 and the device side surface of the package substrate 131, and can a metal, for example. The lid 151 can form an RF shield. The lid 151 can be of other materials that will protect the physics cell, and can be replaced by an overmolded dielectric such as a mold compound, resin, epoxy, or plastic. Low modulus material can be used to reduce stress on the physics cell 103 in addition to a metal lid 151 or overmolded material used to cover the physics cell 103.

Figure 2B:
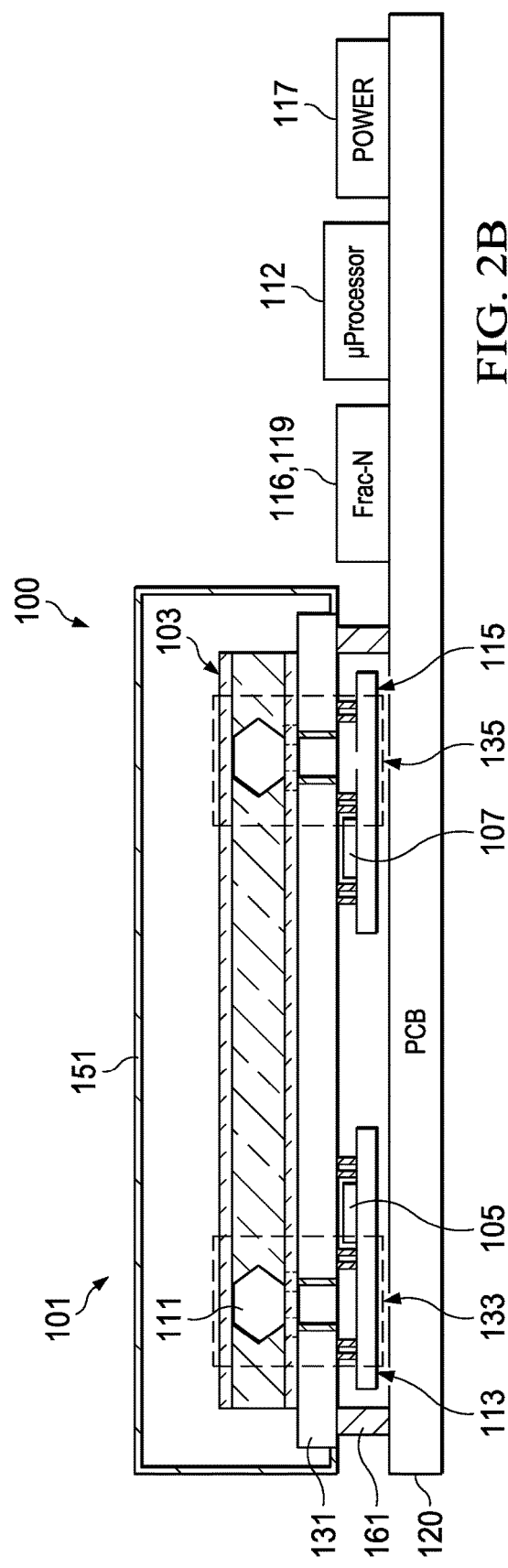
FIG. 2B illustrates in a cross sectional view a portion of a molecular clock system including the package of FIG. 2A on a printed circuit board.

FIG. 2B illustrates, in another cross section, a portion of a system 100 mounted on a system printed circuit board (PCB) 120. The components external to the packaged clock module 101 are shown mounted to the PCB 120, for example the fractional N circuits 116, 119, the microcontroller 112, a power circuit 117. The packaged clock module 101 is shown in the cross section and includes the physics cell 103, a package substrate 131, the millimeter wave transmitter module 113 with transmitter die 105, and the millimeter wave receiver module 115 with receiver die 107. Terminals 161 mount the packaged module 101 to the PCB 120.

In FIGS. 2A-2B, the package substrate 131, which can be an FR-4 substrate, supports the physics cell 103 and the millimeter wave transmitter and receiver modules 113, 115. The package substrate 131 has a transmitter coupling structure 133 and a receiver coupling structure 135. These two coupling structures are formed using openings in the package substrate 131 that are lined with a conductor, such as a plated copper, and are shaped to form waveguides that provide a vertical millimeter signal connection between the transmitter module 113 and one end of the physics cell 103, and another vertical connection between the opposite end of the physics cell 103 and the receiver module 115. By using inexpensive substrate materials and arranging the openings to act as rectangular waveguides, the package substrate 131 provides a cost effective package solution for the clock module 101. Further, in the arrangements the clock module 101 with an FR4 package substrate has been shown to be extremely stable over temperature changes. Packaged clock module 101 provides a set of devices in one component for use in making a clock system, increasing integration and ease of use, and reducing area needed on the system board.

Figure 3A:
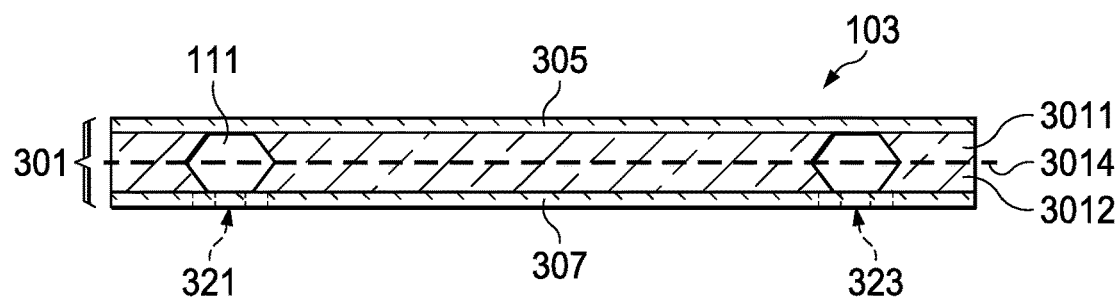
FIG. 3A illustrates in a cross sectional view a physics cell for use with an arrangement.

FIG. 3A illustrates in a cross sectional view the physics cell 103. A substrate 301 includes a gas cell 111 with a tubular, polygonal or circular cross section that is lined with a conductor (not shown for clarity of illustration). In one example process, two wafers are used to form substrate 301. Each wafer has glass substrate bonded to it in a wafer bonding process. One half of the chamber is etched as a cavity pattern into each wafer. The cavities are metallized with the conductor, for example, gold. The two wafers are placed face to face, the gas is introduced, and an AuIn wafer bond process is used to complete the chambers, trapping the gas in the chambers. The individual physics cells on the wafers are separated from the wafers in a singulation process. In FIG. 3A, the two die portions 3011, 3012 are bonded at the dashed line 3014 to form the substrate 301. Glass is used, for example to form a top 305 and bottom 307 layer. A low pressure dipolar gas, in the arrangements OCS gas, is contained in the gas chamber 111 of physics cell 103. Iris openings 321, 323 are formed at opposite ends of the physics cell to receive and transmit the millimeter wave interrogation signals. These openings are made in the conductor layer (not shown) to allow the millimeter wave signals to enter and exit the gas chamber 111.

Figure 3B:
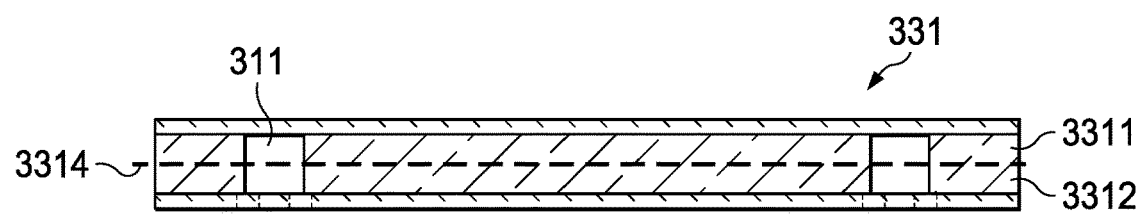
FIG. 3B illustrates in an alternative arrangement a physics cell.

A process for forming a sealed gas cell with molecular rotation is described in U.S. Pat. No. 9,529,334, titled "ROTATIONAL TRANSITION BASED CLOCK, ROTATIONAL SPECTROSCOPY CELL, AND METHOD OF MAKING SAME", which is hereby incorporated herein by reference in its entirety. The physics cell 103 can be made using semiconductor process technology. A first die portion 3011 and a second die portion 3012 are formed using silicon etch on two wafers to make a cavity into a silicon substrate, for example, and the two portions are bonded face to face using AuIn wafer bonding (indicated by the dashed line 3014) to form gas chamber 111. Because wet etching of silicon using an anisotropic etch, for example TMAH wet etch, produces a trench with sloping sides, the polygonal shape shown in FIG. 3A for the gas chamber 111 is obtained. If a different silicon etch process is used, for example a dry reactive ion etch (DRIE) process, the trenches in the two dies may have more or less vertical sidewalls and the gas chamber can have a square or rectangular shape, such as is shown for an alternative shaped physics cell 331 as shown in a cross section in FIG. 3B, when the two dies 3311 and 3312 are bonded face to face as indicated by the dashed line 3314. A rectangular gas cell 311 is then formed. The gas chambers 111, 311 shown in FIGS. 3A and 3B in cross section with two ends exposed, but are a continuous chamber plated with a conductor. Two openings are formed in the conductor at the two ends of the gas chamber. The gas chamber is designed with dimensions that are determined to provide efficient transmission of the millimeter wave signals from a first end of the gas chamber to a second end of the gas chamber.

The gas chamber is shaped and sized to act as a waveguide. In an example, when the OCS gas is used and the selected resonant frequency is about 121 GHz as is further described below, the gas chamber 111 can be dimensioned similar to rectangular waveguide WR8, which has a band of operation from 70 GHz to 140 GHz, and has dimensions of about 2 millimeters×1 millimeter in cross section. By sizing the gas chamber 111 or 311 appropriately for the frequency signals being used, the mode of propagation can be a single transverse electric (TE) mode, making the transfer of energy through the gas chamber most efficient. For example, when the frequency of the signals being applied to the gas chamber are about 121 GHz, a transverse electric propagation mode of TE10 is desired. Further the transmission through the gas chamber should be confined to a single transverse electric mode ("monomode") to avoid losses by mode conversion. By sizing the gas chamber appropriately, and by designing the dimensions of other elements of the system to make efficient transmission at transmitted frequencies, a system with high insertion loss and low reflective loss from the transmitting millimeter wave integrated circuit to the receiving millimeter wave integrated circuit is achieved. The length of the gas chamber 111 affects the magnitude or "depth" of the absorption response. When the quantized frequency signal is applied to the physics cell, the dipolar gas will absorb the energy and transition from a first rotational state to a second rotational state. When other frequencies are applied, the signal will not be absorbed by the gas chamber and most of the energy will be received by the receiver. To increase the signal to noise ratio (SNR) and the quality of the response, the gas chamber 1 should be made as long as is practicable for a given package substrate area. In the example arrangements illustrated here, a serpentine shape is used for the gas chamber to lengthen it on the substrate. In an alternative arrangement, the gas chamber can be made a "U" shape. In example arrangements, the length can vary from end to end from about 10 millimeters to 150 millimeters for an OCS gas cell, with a longer cell providing better SNR than a shorter cell.

As shown in FIG. 3A, the gas chamber 111 has an "iris" opening 321, 323 at each end where the conductive liner is opened to allow signals to enter, and exit, the gas chamber. A metal pattern on the glass surface (not shown, see FIG. 3C) can provide a shield surrounding the iris opening at each end.

Figure 3C:
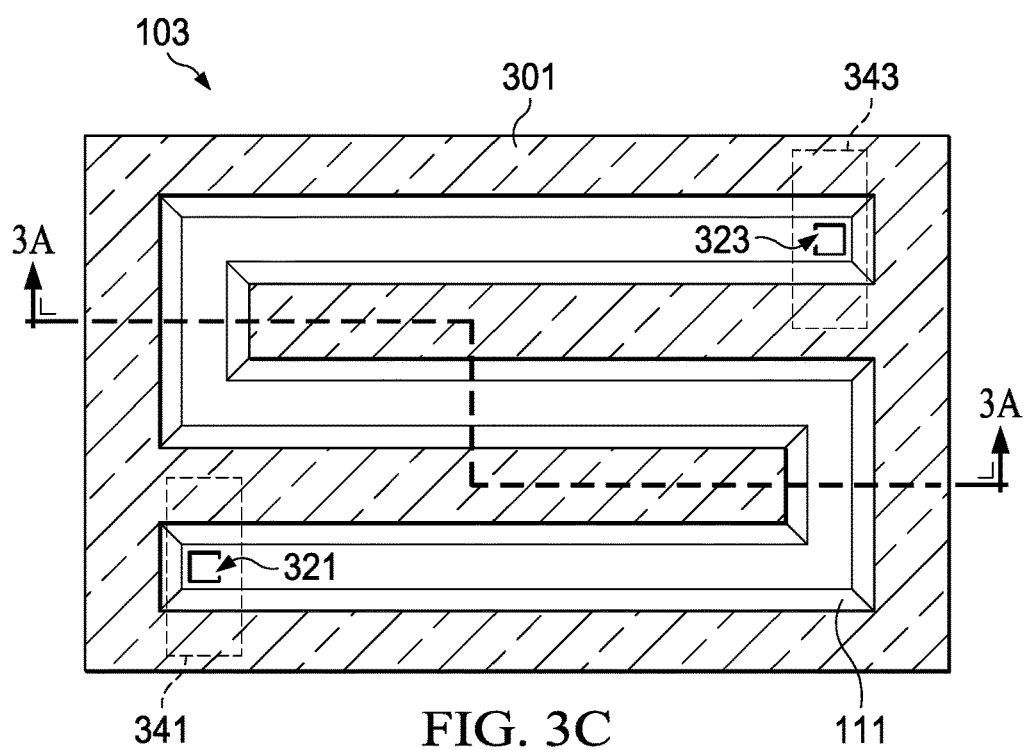
FIG. 3C is a plan view of a physics cell for use with the arrangements.

FIG. 3C illustrates the physics cell 103 in a plan view. Substrate 301 is shown with the tubular gas chamber 111 extending from a first coupler 341 at a first end and having a second coupler 343 at a second end. The couplers are positioned around the iris openings 321, 323 in the conductor lining the tubular gas chamber 111 and are configured to receive, and transmit, millimeter wave energy into the dipolar gas within the gas chamber 111.

Figure 4A:
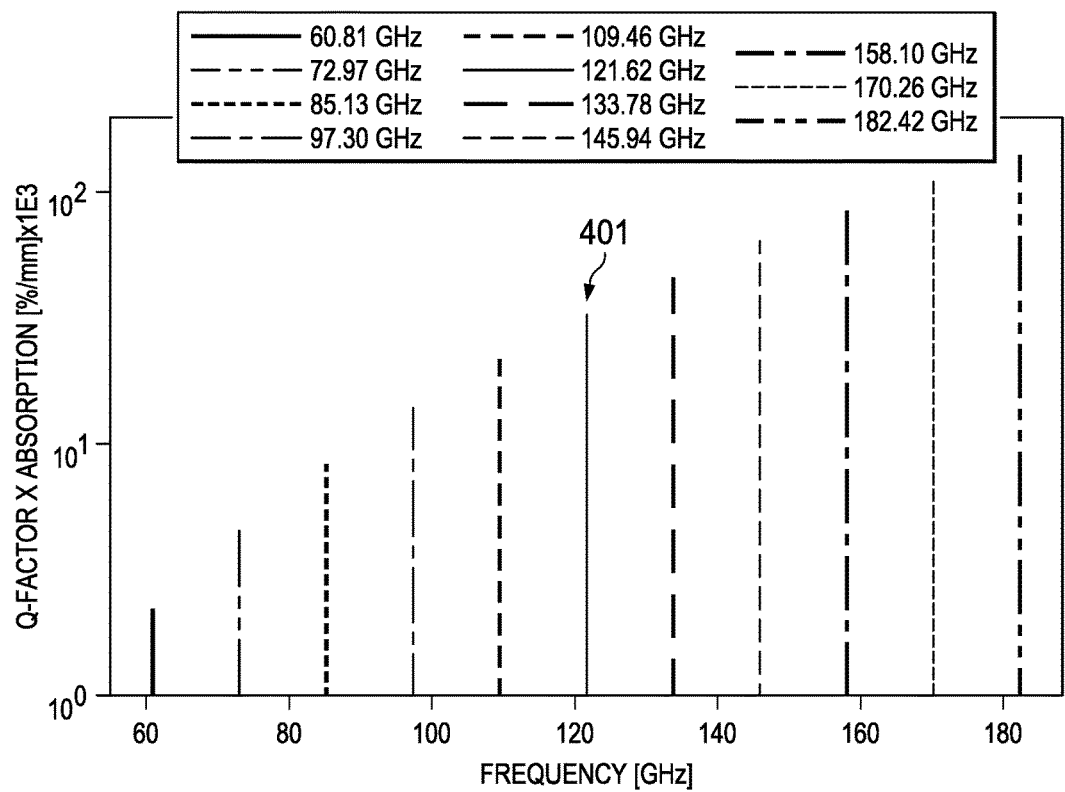
FIG. 4A illustrates in a graph the absorption frequencies of an OCS gas cell having quantum rotational transitions.

FIG. 4A illustrates the absorption frequency spectrum for OCS gas over a range of GHz frequencies from less than 60 GHz to above 180 GHz. The molecular rotational frequencies are quantized at discrete frequencies, about 12 GHz apart from one another. The absorption is plotted on the vertical axis while frequency is plotted on the horizontal axis. Referring to FIG. 1, as signal absorption increases in the physics cell, the remaining signal that will be output to the receiver by the physics cell decreases, further as can be seen in the graph in FIG. 4, the absorption is quantized. By applying an interrogation signal near one of the quantum rotational levels, and by then tuning the interrogation signal, the quantum rotational frequency can be used to lock a signal at a known frequency.

Use of the dipolar gas cell has several advantages. Unlike some other atomic clock cells which are stimulated with optical energy and require temperature control to remain stable, such as a precise heating element, the dipolar gas cell is stable over temperature, reducing the need to tightly control the cell temperature using heaters or other added circuitry. Unlike optically stimulated clock cells, in the arrangements no optical transducers are needed. In example arrangements, a quantum frequency 401 of about 121.62 GHz was used, although it can be seen from examining FIG. 4A that other quantum frequencies may also be used. A useful alternative would be the next adjacent higher quantum frequency, of 133.78 GHz. Another useful alternative would be the next lower quantum frequency, of 109.46 GHz. Because the wavelength of a 121.62 GHz signal, in air, is about 2 millimeters, this frequency is particularly useful in the arrangements as the available dimensions of the various components relative to the wavelength make design of an efficient and cost effective transmit and receive path feasible. Note that the wavelength of the millimeter wave signals in a low-k dielectric material (such as in a high performance substrate) will be less than in air, for example, 900 microns or less at 121.62 GHz.

There are design trade-offs that need to be made in determining the dimensions of the gas chamber, the size and shapes of the openings in the package substrate, and the design of the millimeter wave transmitter module, and the corresponding millimeter wave receiver module. As can be seen in FIG. 4A, as frequency increases, the magnitude of the response (amplitude or signal strength) at the quantized rotation frequencies also increases. Detecting the absorption frequency is clearly enhanced by a stronger response. However, as frequency is increased above 100 GHz and even further such as 180 GHz, the availability of cost effective transmitter and receiver integrated circuits is reduced. If a frequency above the Fmax cut off limit for CMOS technology integrated circuits is selected, the cost of the system will increase, as the integrated circuits will need to be of more expensive technologies, such as GaAs, which can operate at higher frequency. The dimensions of the various features of the arrangements are also related to the wavelengths of the signals used. A signal of 121 GHz has a wavelength, in air, of about 2.47 millimeters. The size of the openings in the package substrate, the cross sectional dimensions of the gas chamber, and the design of the millimeter wave transmitter module and the millimeter wave receiver module, are all impacted by the frequency and the wavelength of the signals. Simulations including the various elements can be used to insure the system has high insertion loss between the transmitting integrated circuit and the receiving integrated circuit, and low reflective loss, for the frequencies selected. When a 121 GHz signal is used, the gas chamber and the openings in the package substrate can be arranged similar in dimensions to a WR8 rectangular waveguide, which has a useful frequency bandwidth from about 90 GHz to about 140 GHz. This waveguide has a width of about 2 millimeters and a length of about 1 millimeter in cross section, which are useful sizes for the package substrate and physics cell of the arrangements. Higher frequency signals will have correspondingly smaller wavelengths, in contrast lower frequency signals will have larger wavelengths. In selecting the dipolar gas, the rotational frequency to be used, and dimensions for the various elements of the arrangements, simulations can be performed to ensure the module will have the desired performance. The selection of the millimeter wave transmitter and receiver integrated circuits is also determined, in part, by the frequency of the signals being used.

Figure 4B:
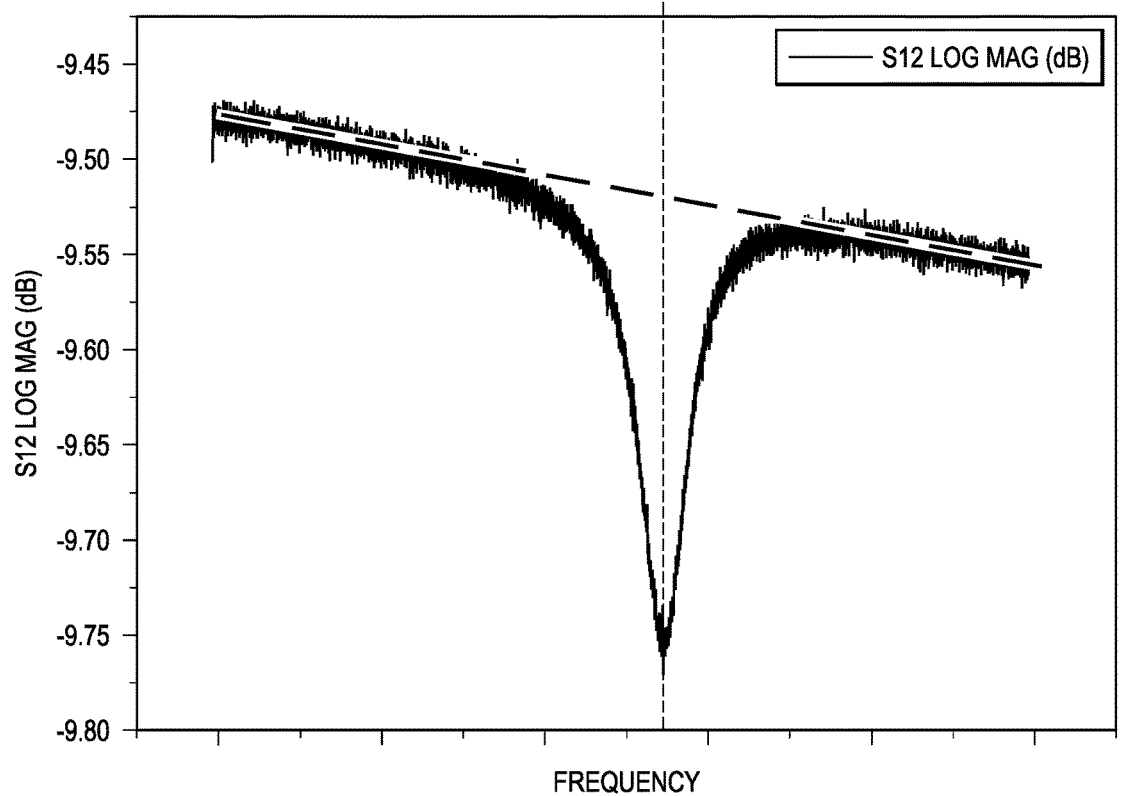
FIG. 4B illustrates in a graph an example of absorption of a signal at a quantum frequency.

FIG. 4B illustrates in a graph an example frequency response showing an amplitude minimum for an OCS dipolar gas cell in response to a quantized rotational frequency signal. The rotation frequency Fr causes the molecules in the gas cell to absorb the energy, using the signal energy to transition from a first rotational state to a second rotational state, so that the remaining energy output from the gas cell is at a minimum; as shown in FIG. 4B, the magnitude of the remaining signal drops sharply at the rotational frequency Fr. The millimeter wave receiver and processor (see FIG. 1) can then be used to detect the rotational frequency, and lock the frequency to the rotational frequency of the gas in the physics cell. A highly stable clock signal can be generated using the transmitted signal as a reference.

While OCS is a useful dipolar gas for the example arrangements, other gasses that exhibit quantized rotation can be used. The choice of the gas can be determined considering several factors, including the quantized spectrum frequencies available, whether the gas is corrosive or reacts with metal such as the conductor liner of the gas cell, which may reduce the volume of available molecules over time (for example water vapor can be consumed in an oxidation reaction with copper); whether the gas is a stable molecule over time; whether the gas is safe to humans or animals if it should escape the gas cell into the environment; and whether the gas is safe to use in production of the gas cells. Availability and cost of the gas are also considered. The dimensions of the openings in the substrate, the cross sectional area of the gas chamber, the length of the gas chamber and other dimensions can also be impacted by the choice of the gas, because the rotational frequency will change. As described above, the choice of the rotational frequency used changes the wavelength of the signals and impacts the dimensions of the various elements.

Figure 5A:
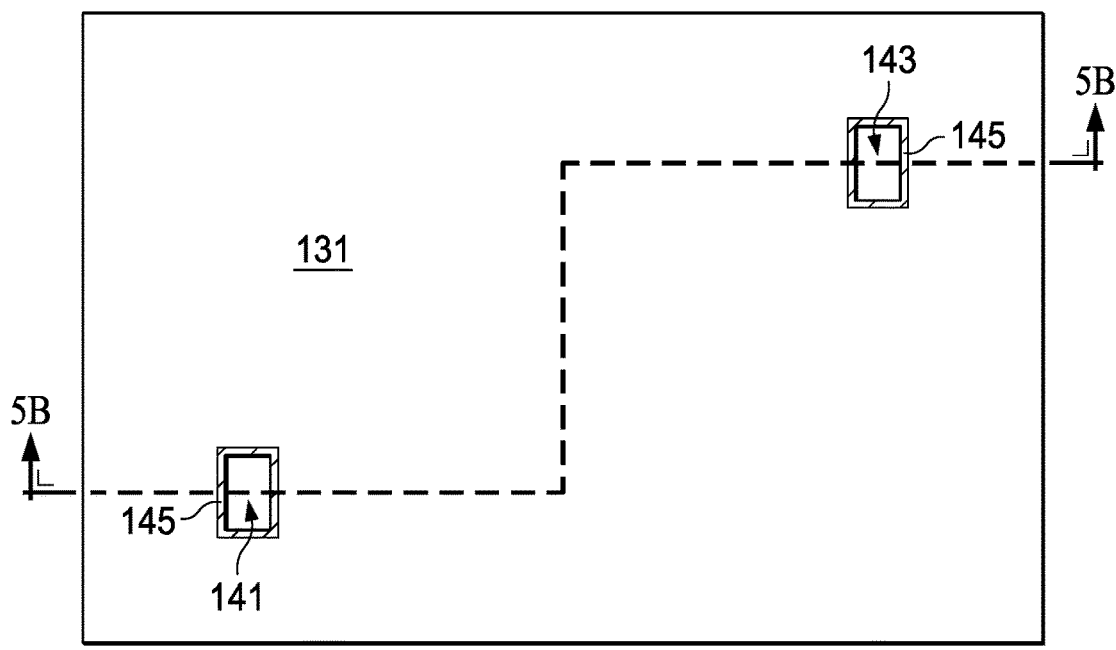
FIGS. 5A-5B illustrate in a plan view and a cross section, respectively, a package substrate for use with the arrangements.

FIG. 5A illustrates, in a plan view, an example package substrate 131 for use in an arrangement. Openings 141, 143 are used to form vertical waveguide structures, along with additional components described below. Conductor material 145, which can be a copper plated material, gold plated material, or other conductor, lines the openings 141, 143. Substrate 131 may have additional conductors and traces formed to route signals, or power, to the millimeter wave modules, as shown in FIG. 1 above. None of the millimeter wave signals are routed in traces formed in the package substrate 131, making the use of a lower cost, low frequency substrate material possible. Instead the millimeter wave signals traverse the openings 141, 143 which act as millimeter wave couplers, or as vertical waveguides. In an example arrangement, the first opening and the second opening are rectangular in cross section and have a width and length of approximately 1 millimeters and approximately 2 millimeters, respectively, in an example arrangement when a transmitted frequency signal is about 121.62 GHz, a quantized rotational frequency for OCS gas. If the frequencies used or the dipolar gas selected change, then other opening sizes can be used to make efficient millimeter wave transmission to and from the physics cell.

Figure 5B:
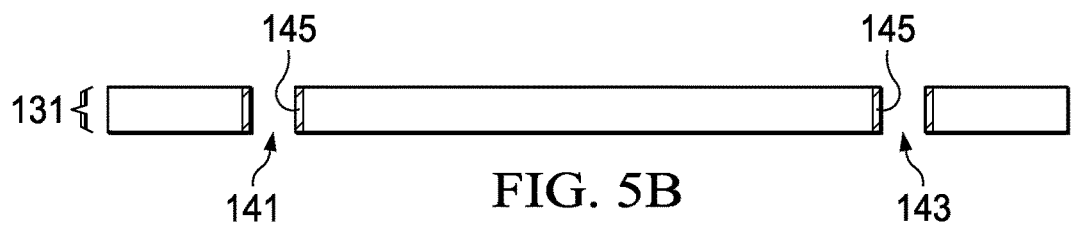

FIG. 5B is a cross sectional view of the package substrate 131 taken along the line B-B' in FIG. 5A, showing the openings 141, 143 extending through the package substrate 131, and having conductor material 145 lining the openings. The openings and conductor in the package substrate can be formed using printed circuit board fabrication techniques, by laser drilling, etch or stamping the openings and by plating the conductor liner 145. Note that the plan view of FIG. 5A shows the openings 141, 143 positioned to correspond to the ends of the gas chamber of the physics cell 103. When a different shaped physics cell is used in an alternative arrangements, the positions of the openings 141, 143 will be moved in correspondence with the different shaped tubular gas chamber. The dimensions of the package substrate will be determined, in part, by the size of the physics cell. The physics cell will have better SNR performance as longer lengths of the gas chamber are used, so it may range from 10 millimeters to 150 millimeters in length. The package substrate to support these physics cells can be from 12×12 millimeters squared, to about 25×25 millimeters squared. The package substrate can have a thickness similar to substrates used for semiconductor devices, for example, from 1 to 2.5 millimeters. Thicker substrates can also be used.

Figure 6:
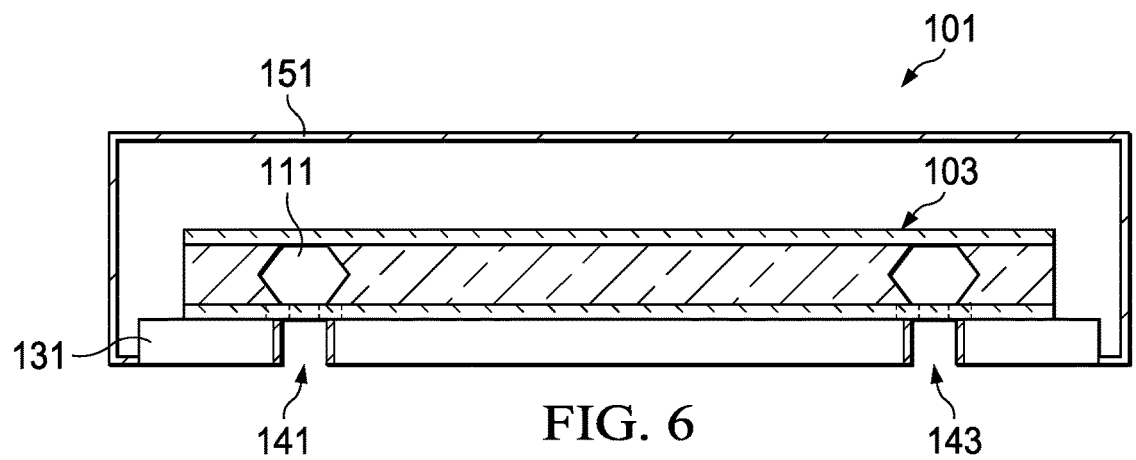
FIG. 6 illustrates, in a cross sectional view, a portion of an arrangement including a physics cell mounted on a package substrate.

FIG. 6 illustrates in a cross-sectional view a partial assembly step of module 101. The package substrate 131 has the physics cell 103 mounted on a device side surface, and a cover 151 is shown protecting the physics cell 103. Openings 141, 143 are shown positioned in correspondence with the first and second ends of the gas chamber 111. Openings 141, 143 will be used to transmit and receive the millimeter wave signals to the physics cell 103.

Figure 7A:
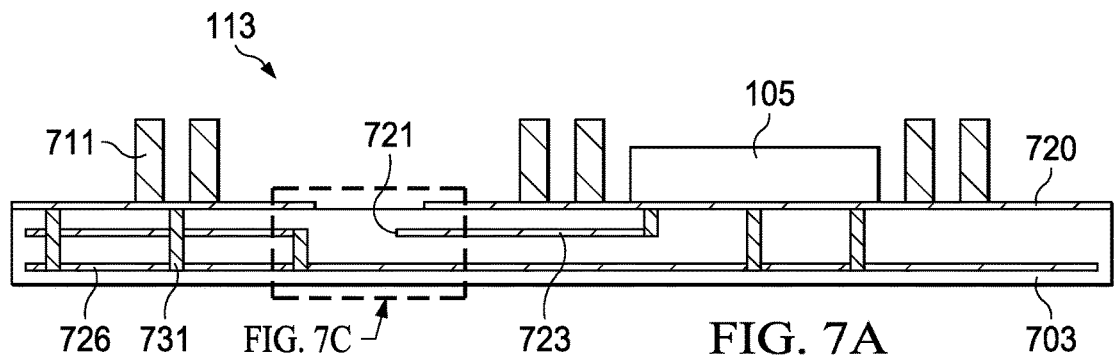
FIGS. 7A-7D illustrate, in a cross sectional view, a close up top view, and in further cross sectional views, portions of a millimeter wave module for use with the arrangements.

FIG. 7A illustrates, in a cross sectional view, a millimeter wave transmitter module 113 for use with the arrangements. In FIG. 7A, a transmitter die 105 is shown on a high performance, high frequency substrate 703. In an example, a millimeter wave compatible high frequency substrate from Shinko was used with four levels of metal conductors in a dielectric material. Substrates with more or fewer conductor levels can be used. Solder balls or solder bump connections 711 are shown placed on the die side surface of substrate 703. A top ground conductor layer 720 overlies the surface of substrate 703. A coplanar waveguide structure 723 is formed in a metal layer of the substrate 703 below the top ground layer 720 and is coupled to the transmitter die 105 by a conductive via or trace. This coplanar waveguide structure 723 is positioned with an antenna end 721 placed in correspondence with an opening 141 in the package substrate 131 (see FIG. 2, for example) and will transmit signals into that opening. A bottom ground plane 726 is formed by a conductor 727 that is below the coplanar waveguide 723. The bottom ground plane is beneath the coplanar waveguide and is grounded and coupled to the top ground plane 720 by vias 731. These vias surround the position where antenna 721 is positioned. Additional vias 731 (not shown for clarity) will couple the top and bottom ground planes together across substrate 703. Solder balls or bumps 711 surround an opening in the top ground plane 720 over the antenna 721, these solder bumps form a guide, similar to a waveguide, for directing the millimeter wave signals from the antenna upwards to the package substrate (see FIG. 2). In additional alternative arrangements, instead of the coplanar waveguide 723, other transmission line types can be used to couple the millimeter wave transmitter integrated circuit 705 to an antenna. For example, microstrip, stripline, and other coplanar waveguides that are not grounded, or where the top ground plane is omitted, can be used.

Figure 7B:
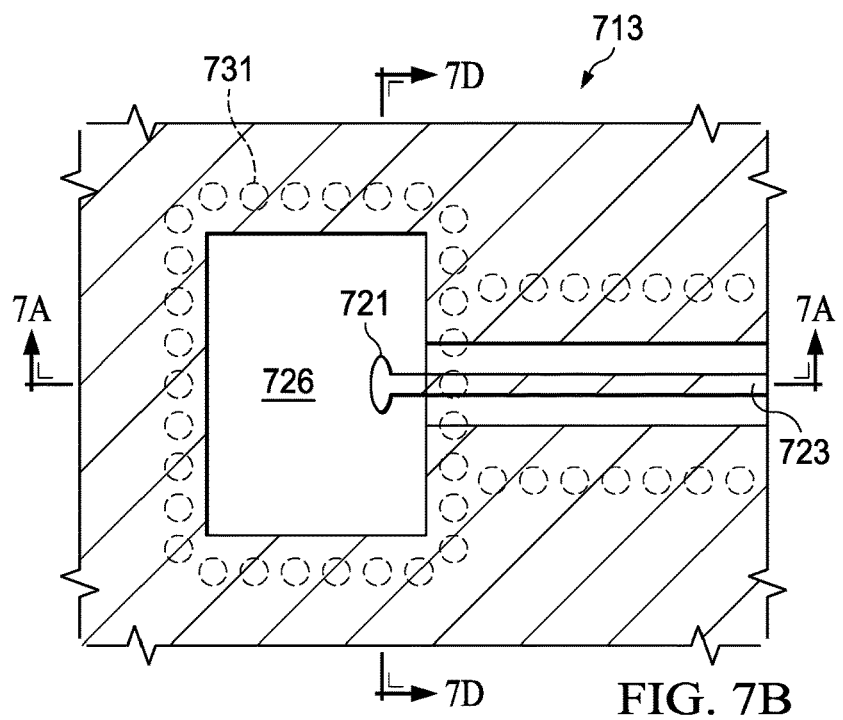

FIG. 7B shows in detail a close up, plan view of the coplanar waveguide structure 723. Note in FIG. 7B, conductor layers and vias are shown while the dielectric material is omitted for clarity. An antenna 721 is positioned in a central opening in the top ground plane 720, the antenna 721 is formed at the end of the coplanar waveguide 723 in a level of metal, and the vias 731 are arranged around the opening to act like a waveguide to guide the signals vertically towards the package substrate 131 (not visible in FIG. 7A-7B, see FIG. 2A). Ground plane 726 is beneath the antenna 721 and the coplanar waveguide 723, and covers the bottom of the opening in top ground plane 720. By using these features as millimeter wave guide structures, a cost effective microwave coupling between the millimeter wave transmitter module and the package substrate is created. The millimeter wave transmitter die 105 implements functions such as the "×12" multiplier in FIG. 1, a power amplifier, sensors, and other circuit components needed to condition and transmit the interrogation signal. Note that the receiver module 115 in FIG. 1 is symmetrical to the transmitter module 113 and the cross section of FIG. 7A, and the plan view of the coplanar waveguide 713 of FIG. 7B, will apply to the millimeter wave receiver module 113 as well.

Figure 7C:
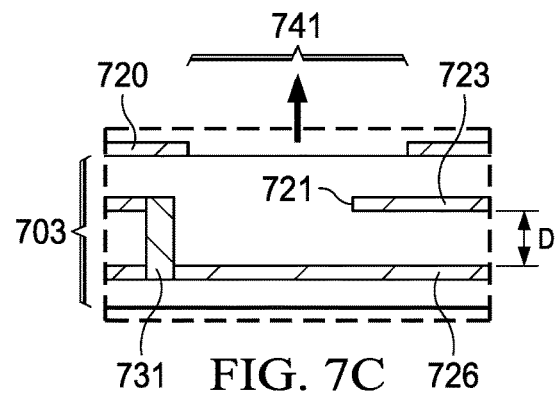
Figure 7D:
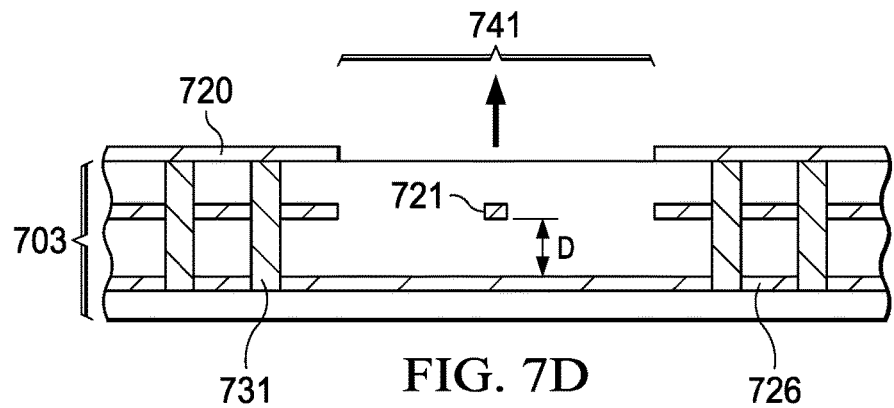

FIGS. 7C-7D are cross sectional views of the substrate 703 of the millimeter wave transmitter module 113, used to illustrate some additional elements. In FIG. 7C, a side view of a portion of the coplanar waveguide 723 with the antenna 721 is shown. Top ground plane 720 has an opening 741 that corresponds to the opening 141 in the package substrate (not shown). A spacing distance "D" is shown between the coplanar waveguide 723 and the bottom ground plane 726. The coplanar waveguide 723 and the top and bottom ground planes 720, 726 are conductor layers and can be formed of copper, for example.

FIG. 7D is an additional cross sectional view of the coplanar waveguide looking towards the antenna 721. Top ground plane 726 has an opening 741, and bottom ground 720 is formed in a conductor layer beneath the coplanar waveguide and antenna 721, which is a conductor layer, such as level 1, above the bottom ground plane layer 720. The distance "D" is determined to increase the efficiency of the transmission of the millimeter wave signals. For a frequency of about 121 GHz, for example, the wavelength (in air) is about 2.4 millimeters. The radiation lobes from the antenna 721 will be, initially, symmetric so that the signal radiates up towards the opening 741, and down towards the ground plane 720. By choosing the distance D correctly, a constructive interference signal can be created by reflection so that an in-phase reflection appears traveling upwards as oriented in FIGS. 3C, 3D and shifts the radiation lobe from a symmetric pattern to an asymmetric pattern with most of the energy traveling upwards; in FIGS. 7C, 7D this is represented by the arrow. Assuming a reflection at the bottom plane 726 shifts the signal by $\lambda/2$, the distance D should be selected to be $\lambda/4$, so that the total phase shift for a signal traveling down from the antenna 721 to the bottom ground 726 and back to the antenna 721 is $(\lambda/4+\lambda/2+\lambda/4)=\lambda$. When distance D is correctly determined, the reflected signal will add to the signal traveling upwards from the antenna 721 in a constructive interference pattern.

In the examples in FIGS. 7A-7D, coplanar waveguide is used as a transmission line o couple the millimeter wave integrated circuits to antennas. However, in alternative arrangements, microstrip or stripline conductors can be used. The top ground plane shown in the examples can be omitted, or changed. The shape of the antenna shown is one example, other shapes can be used. High frequency simulation tools can verify the efficiency of a proposed design, and the design can be tuned to determine the correct value for distance "D", for example.

Figure 8:
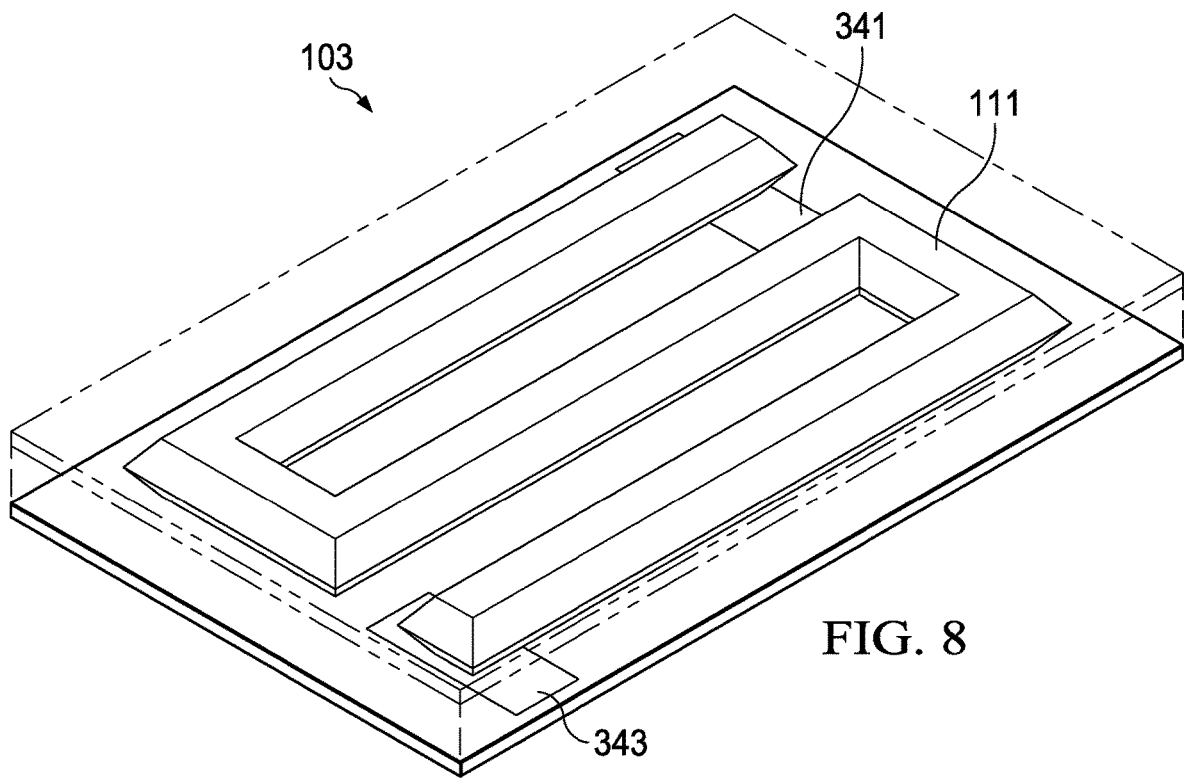
FIG. 8 illustrates, in a projection view, a physics cell for use with the arrangements.

FIG. 8 illustrates, in a projection view, details of one example of a physics cell 103. As seen in FIG. 8, the physics cell 103 includes a serpentine gas chamber 111 that is lined with a conductor such as gold. A receiver iris 343 is at one end of the chamber, and a transmitter iris 341 is at the other end of the gas chamber 111. The ends of the gas chamber 111 are positioned and aligned with the openings in the package substrate 131 as shown above.

Figure 9A:
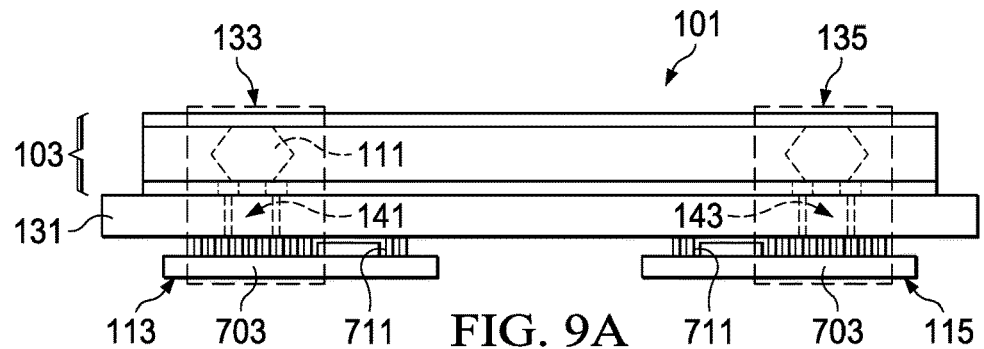
FIGS. 9A-9B illustrate, in a side view and an end view, a physics cell, a package substrate and millimeter wave modules in a molecular clock module package of the arrangements.
Figure 9B:
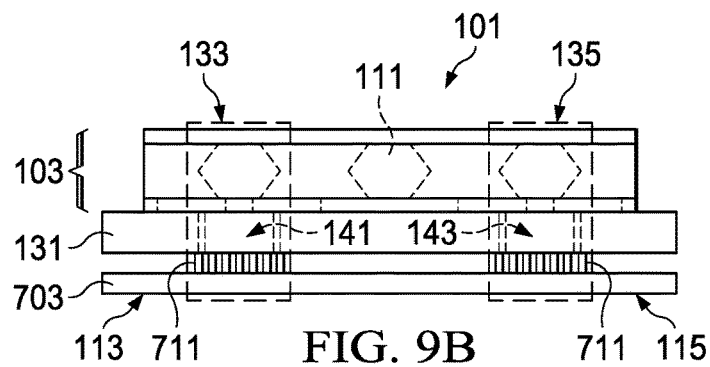

FIGS. 9A and 9B illustrate, in a side view and an end view, the module 101 including the millimeter wave transmit and receive structures 133, 135.

In FIG. 9A, the physics cell 103 is shown with chamber 111 on a device side surface, facing away from a system board side surface, of package substrate 131. The transmit structure 133 includes the opening 141 in the package substrate 131 and the solder balls 711 between the board side surface of package substrate 131 and the transmitter substrate 703, while the receive structure 135 includes the opening 143 in the package substrate 131 that is coupled to one end of the chamber 801 of physics cell 103, and the solder balls 711 that surround the waveguide (not visible) on substrate 703. The millimeter wave transmitter module 113 is shown in part coupled to the package substrate 131 by the solder balls 711. These elements are shown in an end view in FIG. 9B.

The transmit structure 133 includes the opening 141 in the package substrate 131, the solder balls 711 on the millimeter wave transmitter module 113, the coplanar waveguide and antenna structures shown in FIG. 7B, and an iris for receiving signals at one end of the physics cell 103. The receive structure 135 is symmetric, including an antenna at the opposite end of the physics cell 103, the opening 143 in the package substrate 131, the solder balls 711 on the receive substrate of the millimeter wave receive module 115, and the coplanar waveguide and antenna for the receive module. By use of these elements, a cost effective, and temperature stable package is provided for the clock module including the millimeter wave transmitter, the millimeter wave receiver, and the dipolar gas physics cell.

The arrangements reflect several design features selected to lower cost of the packaged module. The use of the millimeter wave transmitter module and millimeter wave receiver module (113, 115) requires a high frequency high performance substrate. These substrates are relatively expensive and the arrangements are designed to reduce the size of these modules as much as possible. In contrast, the package substrate 131 can be selected from a number of inexpensive, often used, widely available, low frequency materials. The size of the package substrate needs to be as large as needed to support the selected physics cell. For example, $12\times12$ mm$^2$ to $25\times25$ mm$^2$ substrates can be used, the size increasing with the length of the gas chamber in the physics cell.

Referring to FIG. 2A, it can be seen that the millimeter wave receiver structure 135 and the millimeter wave transmitter structure 133 include portions of the millimeter wave modules including the coplanar waveguide and antennas, the vias, the solder balls on the millimeter wave modules, the openings in the package substrate, and the iris openings in the physics cell gas chamber. All of these elements are designed together, and work together to make efficient transmission of the millimeter wave signals to the physics cell. Use of the openings in the package substrate to transmit and receive the millimeter wave signals, without the use of high frequency conductors and dielectrics in the package substrate, reduces cost of the packaged clock module.

Figure 10:
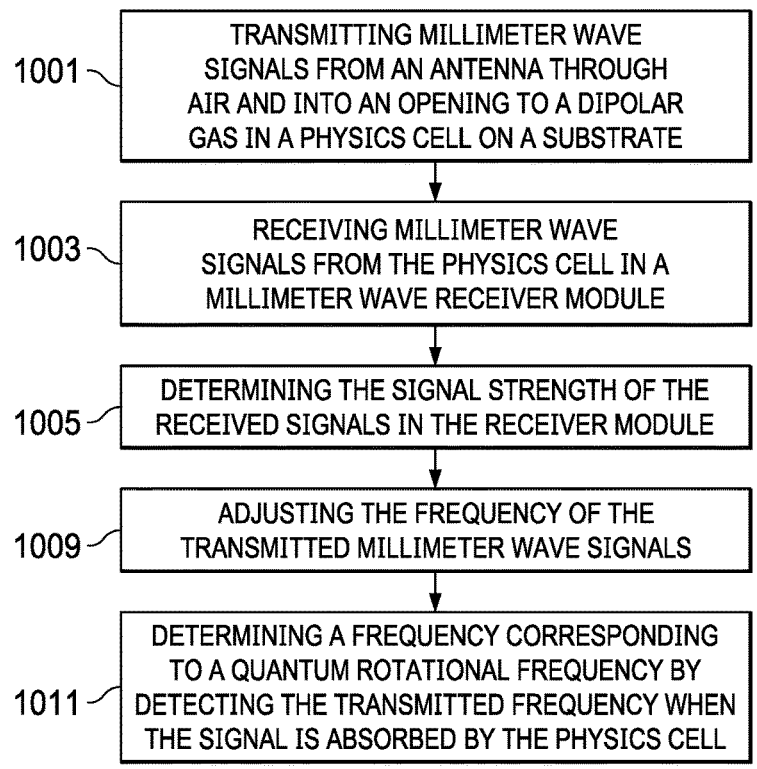
FIG. 10 illustrates, in a flow diagram, a method arrangement.

FIG. 10 illustrates in a flow diagram a method. In FIG. 10, at step 1001, millimeter wave signals are transmitted from an antenna through air into openings to a dipolar gas in a physics cell mounted to a package substrate. At step 1003, millimeter wave signals are received from the physics cell in a millimeter wave receiver module. As described above, this module is also mounted to the package substrate and receives signals at an antenna over the air through an opening in the package substrate. At step 1005, the receiver determines the strength of the signals received, for example as shown in FIG. 1, a square law detector in a millimeter wave integrated circuit can be used in a receiver. At step 1009, the frequency of the transmitted signal is adjusted. This step can be repeated to tune the circuitry if needed. At step 1011, a frequency corresponding to a quantum molecular rotational frequency is determined by detecting the frequency when the signal is absorbed by the physics cell, as shown in FIG. 1, a minimum amplitude may be detected.

Modifications are possible in the described arrangements, and other alternative arrangements are possible within the scope of the claims.

What is claimed is:

1. An apparatus, comprising:
    a package substrate having a device side surface and a board side surface opposite the device side surface;
    a physics cell mounted on the device side surface of the package substrate and including a first section and a second section;
    a first opening extending through the package substrate, and aligned with the first section;
    a second opening extending through the package substrate, and aligned with the second section;
    a millimeter wave transmitter module mounted on the board side surface, the millimeter wave transmitter module including a first substrate attached to the package substrate via a conductive material, and a first die on the first substrate, the first die configured to transmit millimeter wave through the first opening; and
a millimeter wave receiver module mounted on the board side surface, the millimeter wave receiver module including a second substrate attached to the package substrate via the conductive material, and a second die on the second substrate, the second die configured to receive millimeter wave through the second opening.

2. The apparatus of claim 1, wherein the millimeter wave transmitter module further includes a transmission line, wherein the transmission line includes one selected from a coplanar waveguide, a grounded coplanar waveguide, a microstrip, and a stripline.

3. The apparatus of claim 1, wherein the physics cell comprises a gas chamber containing a dipolar gas.

4. The apparatus of claim 3, wherein the dipolar gas is oxygen carbon sulfide (OCS) gas.

5. The apparatus of claim 3, wherein the dipolar gas is a gas that is one selected from oxygen carbon sulfide (OCS), water vapor, hydrogen chloride (HCL), hydrogen cyanide (HCN), and acetonitrile ($CH_3CN$).

6. The apparatus of claim 4, wherein the OCS dipolar gas has a series of discrete quantum rotational frequencies including a quantum rotational frequency of 121.62 GHz+/−10%.

7. The apparatus of claim 1, wherein the first opening and the second opening are rectangular in cross section and have a width and length of approximately 1 millimeters and approximately 2 millimeters, respectively.

8. The apparatus of claim 1, wherein the package substrate comprises a material that is one selected from FR4, BT resin, ceramic, plastic, epoxy, fiberglass, glass reinforced epoxy laminate, paper based laminate, and semiconductor substrates.

9. The apparatus of claim 1, wherein the package substrate comprises FR4, and the conductor lining the first and second openings comprises copper or copper alloys.

10. The apparatus of claim 1, wherein the package substrate has a thickness between 1 millimeters and 5 millimeters.

11. The apparatus of claim 1, and further comprising ball grid array terminals on the board side surface of the package substrate.

12. The apparatus of claim 1, wherein the first substrate includes a printed circuit board, the printed circuit board having a top ground plane on a top surface facing the package substrate, a coplanar waveguide on a first conductor level within the printed circuit board coupled to the first die, a bottom ground plane formed on another conductor level within the printed circuit board positioned beneath the first conductor level and the coplanar waveguide, and vias extending through dielectric material of the printed circuit board and coupling the top ground plane and the bottom ground plane, the vias spaced from the coplanar waveguide.

13. The apparatus of claim 12, wherein the millimeter wave transmitter module further comprises an opening in the top ground plane, the coplanar waveguide ending in an antenna positioned within the opening, the antenna configured to transfer millimeter wave signals from the coplanar waveguide through the opening in the top ground plane through air, and to the first opening in the package substrate.

14. The apparatus of claim 13, wherein the millimeter wave transmitter module is coupled to the package substrate by a plurality of solder balls spaced from one another that surround the opening in the top ground plane, the solder balls attached to the bottom surface of the package substrate by solder joints.

15. The apparatus of claim 13, wherein the opening in the top ground plane of the millimeter wave transmitter module is aligned with the first opening in the package substrate.

16. The apparatus of claim 1, wherein the millimeter wave receiver module includes
a printed circuit board including a top ground plane on a top surface, a coplanar waveguide formed on a conductive layer within the printed circuit board, and a bottom ground plane on a conductive layer beneath the coplanar waveguide, the bottom ground plane and the top ground plane coupled together by conductive vias that extend from the top ground plane to the bottom ground plane through dielectric layers in the printed circuit board and spaced from the coplanar waveguide.

17. The apparatus of claim 16, wherein the coplanar waveguide is coupled between a receiver opening in the top ground plane and the millimeter wave integrated circuit, the coplanar waveguide having a probe in the receiver opening in the top ground plane of the printed circuit board that is aligned with the second opening in the package substrate.

18. The apparatus of claim 1, wherein the conductive material includes a solder ball.

19. The apparatus of claim 1, wherein the conductive material includes a solder bump.

20. The apparatus of claim 1, wherein the first substrate and the second substrate are spaced from the package substrate at least in one view of the apparatus.

21. The apparatus of claim 1, wherein the millimeter wave signal has a frequency of 121.62 GHz+/−10%.

22. The apparatus of claim 3, wherein the dipolar gas is OCS gas, and the millimeter wave signal has a frequency that is one selected from: 109.46 GHz+/−10%; 121.62 GHz+/−10%; and 133.78 GHz+/−10%.

23. A system, comprising:
a millimeter wave clock module comprising a physics cell with a gas chamber containing a dipolar oxygen carbon sulfide (OCS) gas, the physics cell having a first end configured to receive millimeter wave signals, and a second end configured to transmit millimeter wave signals;
a package substrate having the physics cell mounted on a device side surface and having a board side surface opposite the device side surface, the package substrate having:
a first opening through the package substrate aligned with the first end of the physics cell, the first opening configured to transfer millimeter wave frequency signals to the gas chamber of the physics cell; and
a second opening through the package substrate aligned with the second end of the physics cell, the second opening configured to transfer millimeter wave frequency signals from the physics cell;
a millimeter wave transmitter module mounted on the board side surface of the package substrate, having a millimeter wave transfer structure including a transmission line coupled to a first antenna aligned with the first opening, the first antenna configured to transmit millimeter wave signals through the first opening into the physics cell; and
a millimeter wave receiver module mounted on the board side surface of the package substrate and having a millimeter wave transfer structure including a transmission line coupled to a second antenna for receiving millimeter wave signals through the second opening from the physics cell, and aligned with the second opening;
a processor configured to control a clock generator coupled to the millimeter wave clock module, and to detect an amplitude signal from the millimeter wave clock module, the processor controlling the clock generator using the amplitude signal to lock a clock signal to the quantum rotational frequency of the millimeter wave clock module; and a clock output signal that the processor synchronizes to the clock generator, the clock output signal synchronized to a quantum rotational frequency of the millimeter wave clock module, wherein the clock generator includes a bulk acoustic wave oscillator.

24. The system of claim 23, wherein the millimeter wave clock module further comprises:

ball grid array terminals for the millimeter wave clock module on the board side surface.

25. An apparatus, comprising:

a package substrate having a device side surface and a board side surface opposite the device side surface;

a physics cell mounted on the device side surface of the package substrate and including a first chamber and a second chamber;

a first opening extending through the package substrate, and aligned with the first chamber;

a second opening extending through the package substrate, and aligned with the second chamber;

a millimeter wave transmitter module mounted on the board side surface, the millimeter wave transmitter module including a first substrate attached to the package substrate via a conductive material, and a first die on the first substrate, the first die configured to transmit millimeter wave through the first opening and a millimeter wave receiver module mounted on the board side surface, the millimeter wave receiver module including a second substrate attached to the package substrate via the conductive material, and a second die on the second substrate, the second die configured to receive millimeter wave through the second opening.

26. The apparatus of claim 1, wherein the first chamber and the second chamber include a dipolar gas that is selected from one of a oxygen carbon sulfide (OCS), water vapor, hydrogen chloride (HCL), hydrogen cyanide (HCN), and acetonitrile ($CH_3CN$).

27. The apparatus of claim 1, wherein the first chamber is aligned with the first opening in a cross-sectional view of the apparatus.

28. The apparatus of claim 1, wherein the second chamber is aligned with the second opening in a cross-sectional view of the apparatus.

* * * * *